United States Patent
Sebastiani et al.

(10) Patent No.: US 9,407,098 B2
(45) Date of Patent: Aug. 2, 2016

(54) DETERMINING A BATTERY CHEMISTRY FOR A BATTERY IN A PERIPHERAL DEVICE

(75) Inventors: Marco Sebastiani, San Bruno, CA (US);
Louis W. Bokma, San Jose, CA (US);
Nima Parivar, South San Francisco, CA (US)

(73) Assignee: Apple Inc., Cupertino, CA (US)

( * ) Notice: Subject to any disclaimer, the term of this patent is extended or adjusted under 35 U.S.C. 154(b) by 605 days.

(21) Appl. No.: 13/323,336

(22) Filed: Dec. 12, 2011

(65) Prior Publication Data

US 2013/0151181 A1    Jun. 13, 2013

(51) Int. Cl.
*G01R 31/36* (2006.01)
*H02J 7/00* (2006.01)
*H01M 10/42* (2006.01)

(52) U.S. Cl.
CPC ............ *H02J 7/0008* (2013.01); *G01R 31/3665* (2013.01); *H01M 10/4221* (2013.01); *G01R 31/3689* (2013.01)

(58) Field of Classification Search
CPC ..................... G01R 19/16542; G01R 31/3648; G01R 31/3658; G01R 31/3682; Y02E 60/12
USPC ........................................................... 702/63
See application file for complete search history.

(56) References Cited

U.S. PATENT DOCUMENTS

| | | | | |
|---|---|---|---|---|
| 3,899,732 A * | 8/1975 | Staby | | 324/429 |
| 4,418,129 A * | 11/1983 | Goebel | | 429/91 |
| 5,438,270 A * | 8/1995 | Harper et al. | | 324/429 |
| 5,912,544 A * | 6/1999 | Miyakawa | G01R 19/16542 | 320/106 |
| 6,045,941 A * | 4/2000 | Milewits | | 429/91 |
| 6,124,701 A * | 9/2000 | McDowell et al. | | 320/132 |
| 6,215,275 B1 | 4/2001 | Bean | | |
| 6,400,123 B1 * | 6/2002 | Bean et al. | | 320/132 |
| 6,404,164 B1 * | 6/2002 | Bean et al. | | 320/106 |
| 6,479,962 B2 | 11/2002 | Ziemkowski et al. | | |
| 6,748,273 B1 * | 6/2004 | Obel et al. | | 607/29 |
| 7,239,146 B2 * | 7/2007 | James et al. | | 324/426 |
| 7,259,538 B2 * | 8/2007 | Melton et al. | | 320/106 |
| 7,737,581 B2 * | 6/2010 | Spurlin et al. | | 307/66 |
| 8,564,447 B2 * | 10/2013 | Trock et al. | | 340/636.1 |
| 2002/0123672 A1 * | 9/2002 | Christophersom et al. | | 600/300 |
| 2002/0130634 A1 * | 9/2002 | Ziemkowski et al. | | 320/106 |
| 2003/0092437 A1 * | 5/2003 | Nowlin et al. | | 455/420 |
| 2003/0171881 A1 * | 9/2003 | Park | | 702/63 |
| 2004/0078155 A1 * | 4/2004 | Thibedeau et al. | | 702/63 |
| 2004/0095096 A1 | 5/2004 | Melton | | |
| 2004/0178771 A1 * | 9/2004 | Fuge | | 320/136 |
| 2005/0134225 A1 | 6/2005 | Mese | | |
| 2006/0291848 A1 * | 12/2006 | Takahashi | G01R 31/3665 | 396/279 |
| 2008/0097544 A1 * | 4/2008 | Gandhi et al. | | 607/29 |

(Continued)

FOREIGN PATENT DOCUMENTS

| | | |
|---|---|---|
| CN | 100585941 C | 1/2010 |
| EP | 2224575 A1 | 9/2010 |

(Continued)

*Primary Examiner* — Regis Betsch
(74) *Attorney, Agent, or Firm* — Blank Rome LLP

(57) ABSTRACT

Some embodiments provide a system that determines a battery chemistry for a battery in a peripheral device. During operation, the system determines a first voltage of the battery at a first time and a second voltage of the battery at a second time. The first voltage and the second voltage are then compared to one or more predetermined battery usage profiles to determine the battery chemistry.

19 Claims, 5 Drawing Sheets

(56) References Cited

U.S. PATENT DOCUMENTS

| | | | |
|---|---|---|---|
| 2008/0231238 A1* | 9/2008 | Wong et al. | 320/161 |
| 2009/0224771 A1* | 9/2009 | Deveau et al. | 324/600 |
| 2010/0250164 A1* | 9/2010 | Zheng et al. | 702/63 |
| 2011/0202472 A1* | 8/2011 | Wan et al. | 705/345 |

FOREIGN PATENT DOCUMENTS

| | | |
|---|---|---|
| JP | 2000261975 A | 9/2000 |
| TW | 201001242 A | 1/2010 |

* cited by examiner

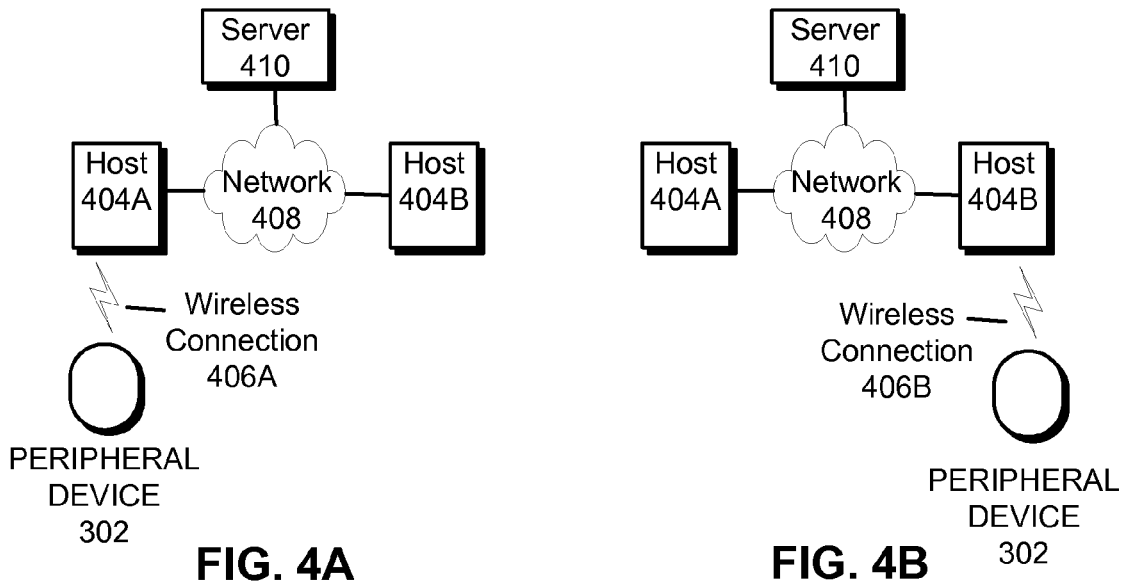
FIG. 4A          FIG. 4B
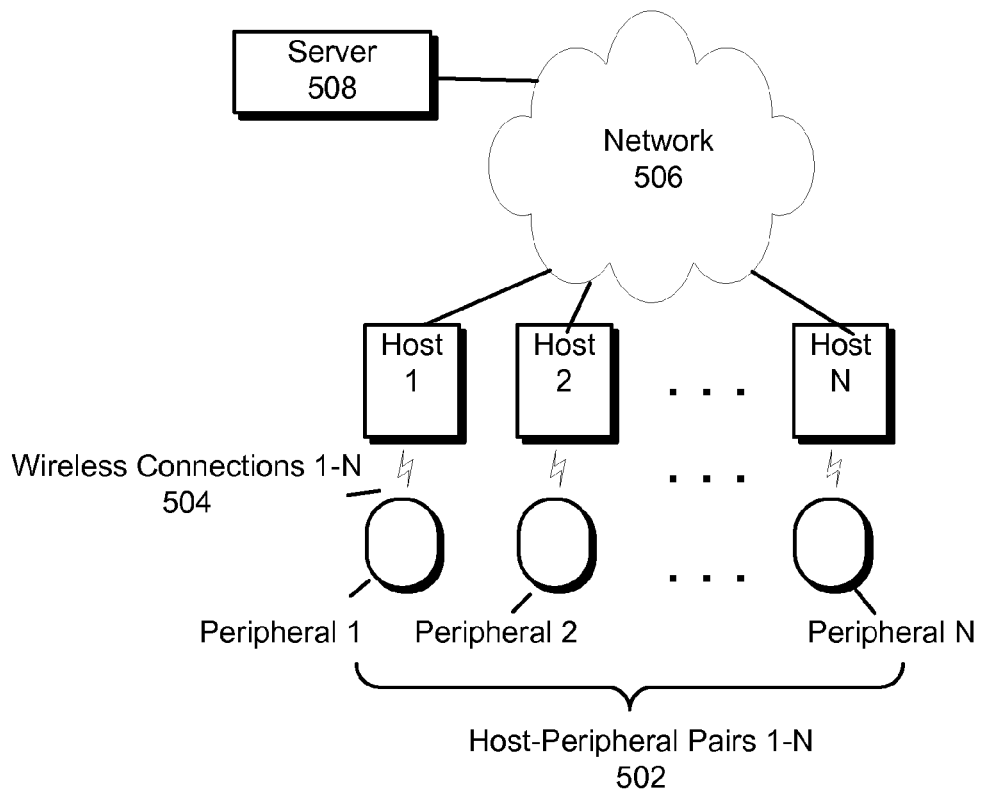
FIG. 5

DETERMINING A BATTERY CHEMISTRY FOR A BATTERY IN A PERIPHERAL DEVICE

BACKGROUND

1. Field

The present embodiments relate to techniques for determining a battery chemistry for a battery. More specifically, the present embodiments relate to techniques for determining a battery chemistry for a battery in a peripheral device.

2. Related Art

Wireless peripheral devices such as Bluetooth® mice, trackpads, keyboards, and headphones are typically powered by replaceable batteries. As the peripheral device is used, the battery is drained and will eventually no longer be able to reliably power the device. Therefore, it is often desirable to be able to predict when a battery will need to be replaced so that the peripheral device does not unexpectedly stop functioning.

One solution has been to use a voltage-based battery "gas gauge" that converts the voltage of the battery into an estimate of the remaining useful battery life. However, replaceable batteries are available in a variety of different chemistries, such as alkaline batteries, nickel metal hydride (NiMH) rechargeable batteries, and lithium disposable batteries, and each battery chemistry typically has different performance characteristics. For example, NiMH rechargeable batteries typically have a lower output voltage (e.g., 1.25 volts per cell) than alkaline batteries (e.g., 1.5 volts per cell). As a result, if the battery chemistry for a battery in a peripheral device is not known, then voltage-based battery "gas gauges" may not be able to accurately determine the relationship between the voltage of the battery and the remaining useful battery life. Additionally, gas gauge circuitry may be prohibitively expensive in both material cost as well as power consumption.

Hence, use of battery-powered peripheral devices may be facilitated by identifying the battery chemistry for batteries in the peripheral device.

SUMMARY

Some embodiments provide a system that determines a battery chemistry for a battery in a peripheral device. During operation, the system determines a first voltage of the battery at a first time and a second voltage of the battery at a second time. Then, the system compares the first voltage and the second voltage to one or more predetermined battery usage profiles to determine the battery chemistry.

In some embodiments, comparing the first voltage and the second voltage to one or more predetermined battery usage profiles to determine the battery chemistry includes communicating the first voltage and the second voltage to a host, wherein the host performs the comparison.

In some embodiments, communicating the first voltage and the second voltage to the host includes communicating using Bluetooth.

In some embodiments, determining the first voltage of the battery at the first time and determining the second voltage of the battery at the second time includes periodically determining a voltage of the battery once every predetermined time period. In some embodiments the predetermined time period is four hours.

In some embodiments, the peripheral device includes at least one of: a mouse, a trackpad, a keyboard, and a Bluetooth headset.

In some embodiments, determining the first voltage of the battery at the first time involves measuring a first loaded voltage and a first unloaded voltage, and determining the second voltage of the battery at the second time involves measuring a second loaded voltage and a second unloaded voltage. Additionally, comparing the first voltage and the second voltage to one or more predetermined battery usage profiles involves comparing the first unloaded voltage and the second unloaded voltage to one or more predetermined unloaded battery usage profiles, and comparing the first loaded voltage and the second loaded voltage to one or more predetermined loaded battery usage profiles.

In some embodiments, the predetermined battery usage profile includes information transmitted to the host using the Internet.

In some embodiments, the information transmitted to the host includes information related to one or more voltages of the battery transmitted from a second host.

In some embodiments, the information transmitted to the host includes one or more updated battery usage profiles.

In some embodiments, the predetermined battery usage profile includes information related to one or more historical battery usage profiles for the peripheral device.

In some embodiments, determining the battery chemistry further includes determining a peripheral device usage metric and using the peripheral device usage metric to determine the battery chemistry.

In some embodiments, the remaining battery life of the battery is determined based on information including the battery chemistry and at least one of the first voltage and the second voltage.

In some embodiments, communicating the first voltage and the second voltage to the host includes communicating information based on the first voltage and the second voltage, wherein comparing the first voltage and the second voltage to one or more predetermined battery usage profiles includes processing the communicated information to retrieve the first voltage and the second voltage.

Also, some embodiments include multiple gas gauges per battery type, or use an equation with one or more parameters that vary based on the detected battery type which apply to a coulomb counter output.

BRIEF DESCRIPTION OF THE FIGURES

FIG. 4A shows a first host and a second host connected to a server through a network with a peripheral device wirelessly connected to the first host.

FIG. 4B shows a first host and a second host connected to a server through a network with a peripheral device wirelessly connected to the second host.

FIG. 5 shows N peripheral-host pairs connected through a network to a server.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included in them.

Figure 1:
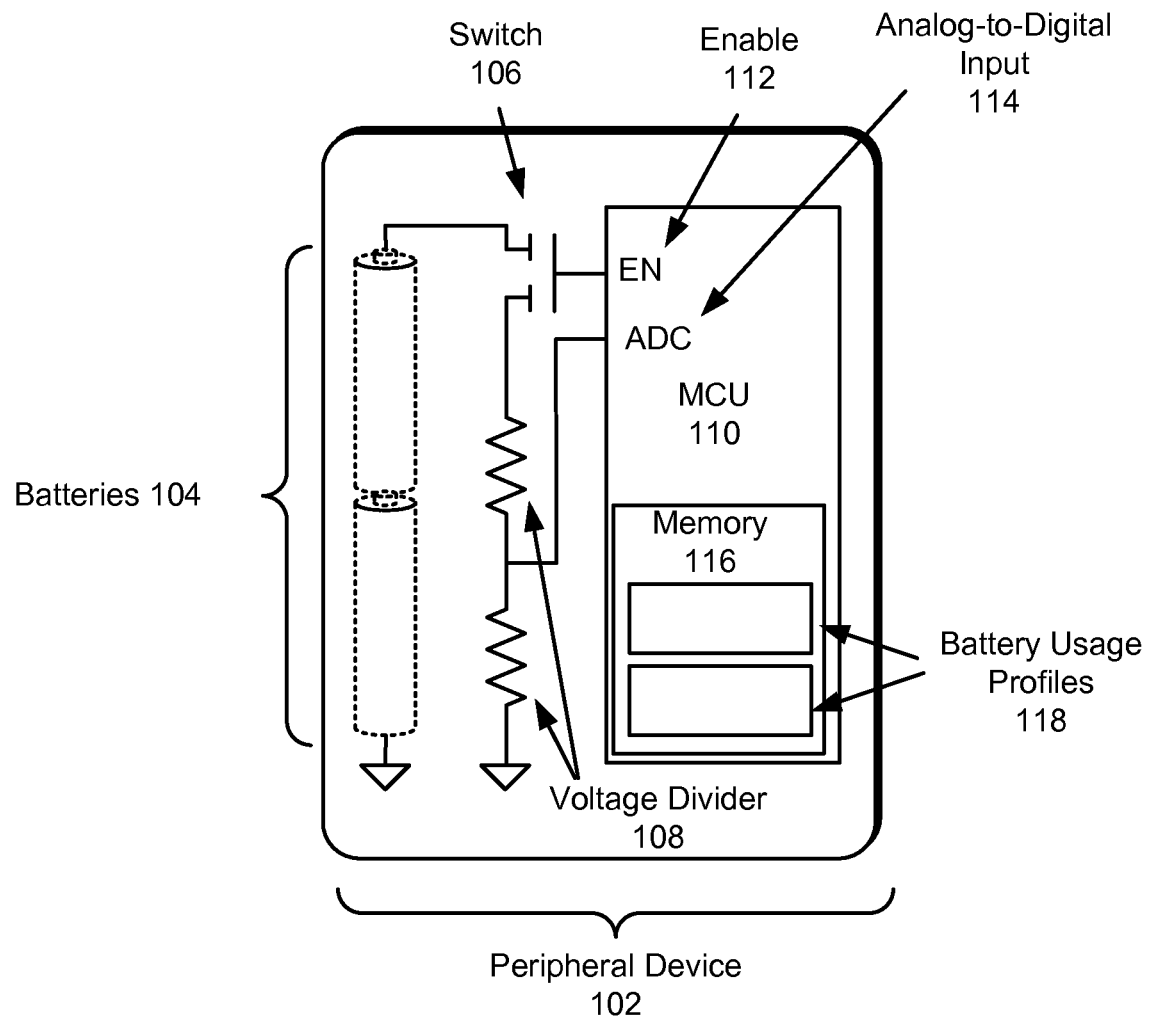
FIG. 1 shows a peripheral device in accordance with an embodiment.

FIG. 1 shows a peripheral device in accordance with an embodiment. Peripheral device 102 includes batteries 104 connected in series through switch 106 to voltage divider 108. Micro-control unit (MCU) 110 controls switch 106 through enable 112, and receives input from voltage divider 108 through analog-to-digital converter input (ADC) 114. MCU 110 includes memory 116 which contains battery usage profiles 118.

Peripheral device 102 may correspond to a mouse, a trackpad, a keyboard, a remote control, wireless headphones, and/or another peripheral device that operates with one or more batteries. Batteries 104 may be any size of battery, including but not limited to: AAA batteries, AA batteries, C batteries, D batteries, nine-volt batteries, button batteries, and/or any other standard or non-standard battery size or shape, and implemented in any battery chemistry, including but not limited to alkaline battery chemistry, nickel metal hydride (NiMH) rechargeable battery chemistry, and lithium disposable battery chemistry.

Battery usage profiles 118 each represent a usage profile of voltage versus discharge capacity for batteries of the same size (e.g., AA) and configuration (i.e., in series) as batteries 104, but implemented in different battery chemistries. For example, one of the two battery usage profiles 118 may represent voltage versus discharge capacity for alkaline batteries while the other one is for lithium batteries. Battery usage profiles are discussed in more detail below with reference to FIGS. 2A and 2B.

Note that although only two battery usage profiles 118 are depicted in memory 116, any number of battery usage profiles 118 may be stored in memory 116 without departing from the invention. Additionally, battery usage profiles 118 stored in memory 116 may be represented in any format, including but not limited to curves of output voltage versus discharge capacity represented as one or more functions, a look-up table, piecewise continuous curves or line segments or any other functional or discrete representation or combination thereof. Additionally, battery usage profiles stored in memory 116 may also include battery usage profiles that are a function of average battery usage, peak battery usage, or any other usage pattern that may affect a battery usage profile. Furthermore, separate battery usage profiles may be stored in memory 116 for batteries of one or more battery chemistry used in any different usage pattern or environment that may affect a battery usage profile. For example, two separate battery usage profiles may be stored in memory 116 for lithium batteries, one for low current drain and one for high current drain.

During operation, MCU 110 closes switch 106 through enable 112. When switch 106 is closed, voltage divider 108 divides the voltage output from batteries 104 to a level that is within the range of ADC 114. ADC 114 then measures the voltage output from voltage divider 108 and stores the voltage in memory 116. Enable 112 then opens switch 106. After a predetermined time has elapsed, MCU 110 again closes switch 106 and the voltage from voltage divider 108 is measured again and stored in memory 116. Then, after at least two voltage measurements have been taken, MCU 110 fits the measured voltages to battery usage profiles 118 and determines the battery chemistry of batteries 104 based on which of battery usage profiles 118 is the best fit for the voltages. The process of fitting the voltages to battery usage profiles will be discussed in more detail below with reference to FIG. 2A.

Figure 2A:
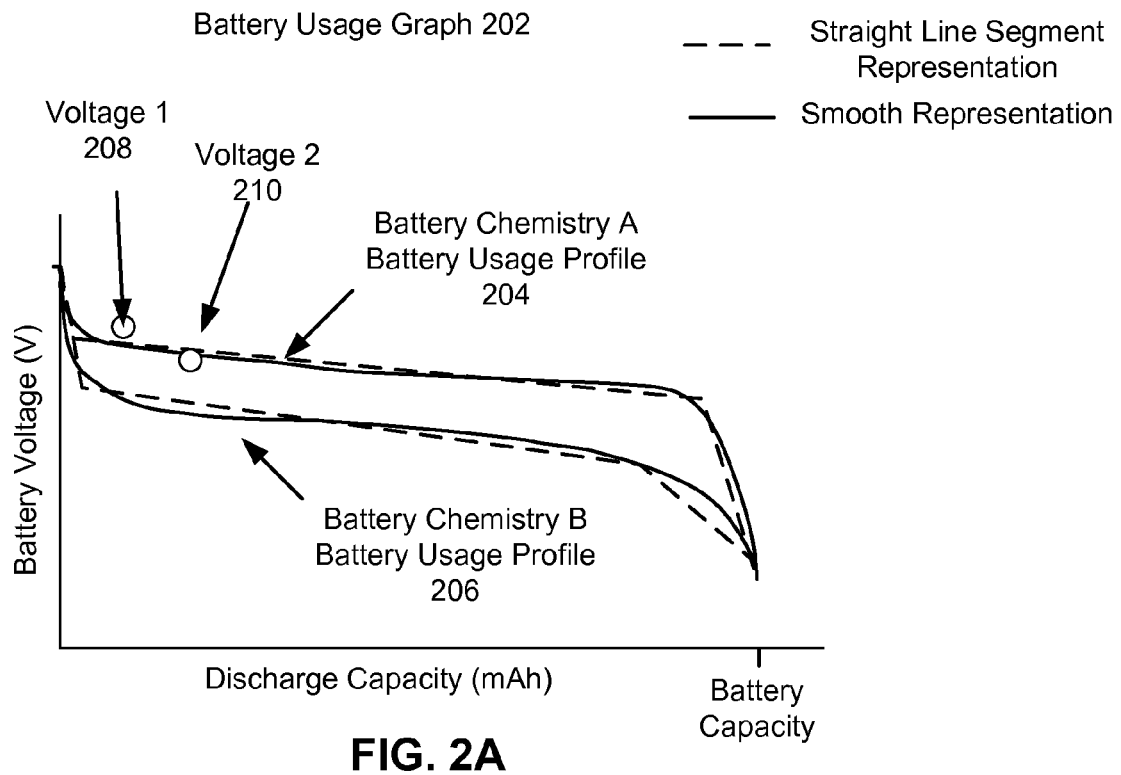
FIG. 2A shows an exemplary battery usage graph in accordance with an embodiment.

FIG. 2A shows an exemplary battery usage graph in accordance with an embodiment. Battery usage graph 202 depicts battery usage profiles for two hypothetical battery chemistries A and B, plotted with volts on the vertical axis and discharge capacity in milliampere hours (mAh) on the horizontal axis. For illustrative purposes battery chemistry A battery usage profile 204 and battery chemistry B battery usage profile 206 are each depicted using a smooth curve representation depicted by a solid curve and a straight line representation depicted by dotted straight lines. Note that either of these representations could be stored in memory 116 without departing from the invention. Voltage 1 208 and voltage 2 210 represent two voltages measured by MCU 110 of FIG. 1 using the process described above.

In some embodiments, the process used by MCU 110 to determine which of the battery usage profiles 118 stored in memory 116 is a better fit to voltage 1 208 and voltage 2 210, proceeds as follows. MCU 110 estimates how many milliampere hours were discharged from batteries 104 between the measurements of voltage 1 208 and voltage 2 210. In some embodiments, this estimate is based on the time elapsed between the two voltage measurements and an estimate of the current drawn by peripheral device 102 during operation.

Note that the estimate of current drawn may be based on one or more of the following: field and/or laboratory test data for peripheral devices similar to, the same as, or the same make or model as peripheral device 102; previous battery usage profile determinations for batteries used in peripheral device 102 or for batteries used in peripheral devices similar to peripheral device 102. Additionally, MCU 110 may estimate the charge drawn from the batteries by tracking the usage of the functions and features of peripheral device 102, and a factory measurement of the charge used by each function and feature, or by directly measuring the charge drained from batteries 104.

These estimates or measurements are used by MCU 110 to determine the horizontal separation between voltage 1 208 and voltage 2 210 when determining which battery chemistry usage profile is a better fit to the voltages. Note that any suitable process may be used to determine which battery chemistry is a better fit to the voltages, such as least squares fit or any other techniques well known in the art. In some embodiments, MCU 110 measures the voltage of batteries 104 at periodic intervals such as every hour or every 4 hours and accumulates more voltage values. MCU 110 then determines which one of battery usage profiles 118 stored in memory 116 is a better fit to these voltages.

Note that in some embodiments MCU 110 determines if batteries 104 have been replaced based on the measured voltage values. For example, if a measured voltage is higher than a previously measured voltage by more than a predetermined amount, then MCU 110 assumes that batteries 104 have been replaced. In some embodiments, when MCU 110 determines that batteries 104 have been replaced, MCU 110 erases the voltage values measured for the removed batteries and begins determining the battery chemistry of the new batteries using the above process. In some other embodiments, MCU 110 will retain the measured voltage values and battery chemistry determinations for replaced batteries and use these to help determine the battery chemistry for the new batteries. For example, when relatively few voltage values have been measured for the new batteries, MCU 110 may determine if the measured voltage values for the new batteries are similar enough to voltage values measured for the previous batteries during the same interval after replacement, and if so MCU 110 may use the battery chemistry determination from the previous batteries.

In another embodiment not depicted in FIG. 1, peripheral device 102 includes another switch, in parallel with switch 106, controlled by MCU 110 that can switch the output from batteries 104 through a known load resistance such as a 7 ohm resistor. During operation of this embodiment, each time MCU 110 measures a voltage of batteries 104, a voltage value is measured with the load resistance switched into the circuit and a voltage value is measured with the load resistance not in the circuit. In this way, each measurement includes an unloaded voltage and a loaded voltage. Furthermore, in this embodiment, battery usage profiles 118 include loaded and unloaded battery usage profiles in which the loaded battery usage profiles are measured under battery loading conditions similar to those of peripheral device 102. For example, the total resistance of the circuit traces, load resistance, and other components in the loaded circuit may be measured during factory calibration and the loaded battery usage profile for that load is stored in memory 116. Alternatively, the total load can be adjusted during a factory calibration to be a predetermined load value and the loaded battery usage profile corresponding to the predetermined load is stored in memory 116.

Figure 2B:
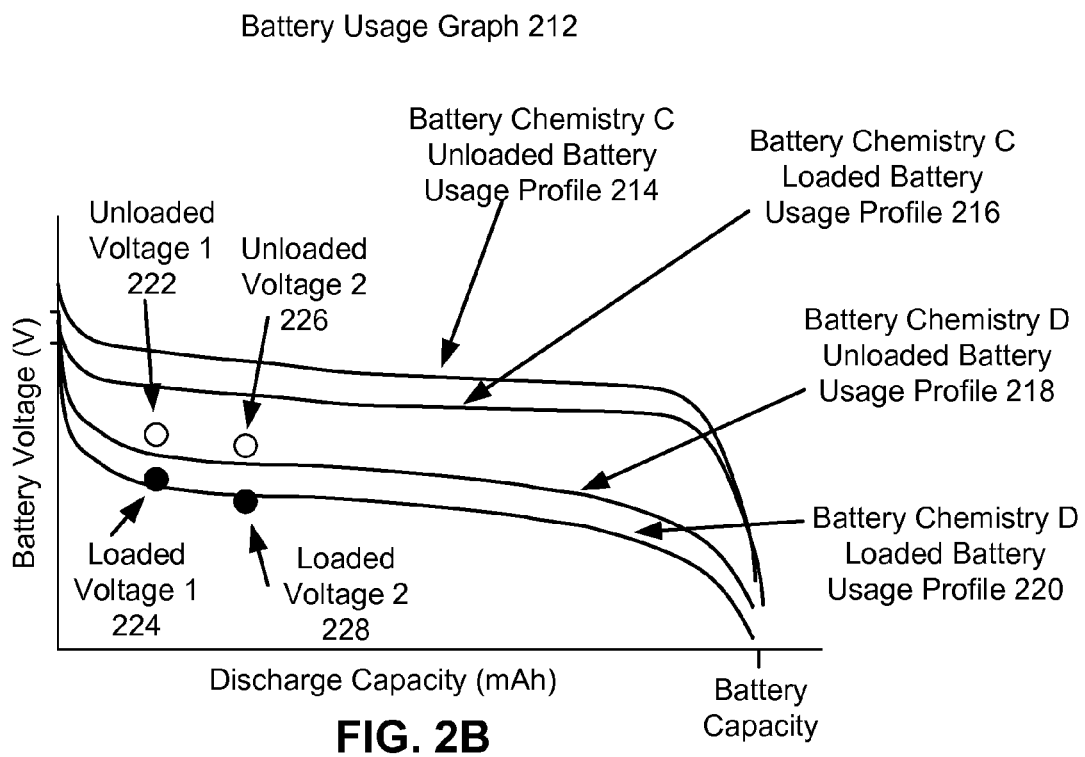
FIG. 2B shows an exemplary battery usage graph including both loaded and unloaded battery usage profiles in accordance with an embodiment.

Referring to FIG. 2B, battery usage graph 212 depicts loaded and unloaded battery usage profiles for two hypothetical battery chemistries C and D, plotted with volts on the vertical axis and discharge capacity in milliampere hours (mAh) on the horizontal axis. Included in battery usage graph 212 are battery chemistry C unloaded battery usage profile 214, battery chemistry C loaded battery usage profile 216, battery chemistry D unloaded battery usage profile 218, and battery chemistry D loaded battery usage profile 220. Unloaded voltage 1 222, loaded voltage 1 224, unloaded voltage 2 226, and loaded voltage 2 228 are voltages measured by MCU 110 using the process described above. Then, using the process described above with reference to FIG. 2A, MCU 110 determines which loaded and unloaded battery chemistry usage profiles are, respectively, a better fit to the loaded and unloaded measured voltages.

In additional embodiments, MCU 110 uses the battery chemistry determination and the corresponding battery usage profile along with one or more of the voltage measurements to determine how much battery life remains before batteries 104 have reached their battery capacity and will need to be replaced. For example, MCU 110 may cause an alert or other indicator to be generated when the remaining capacity of batteries 104 has fallen below a predetermined level or when, based on projected use patterns, there is less than a predetermined time period (e.g., 3 days) of use left before batteries 104 reach their battery capacity and need to be replaced.

Figure 3:
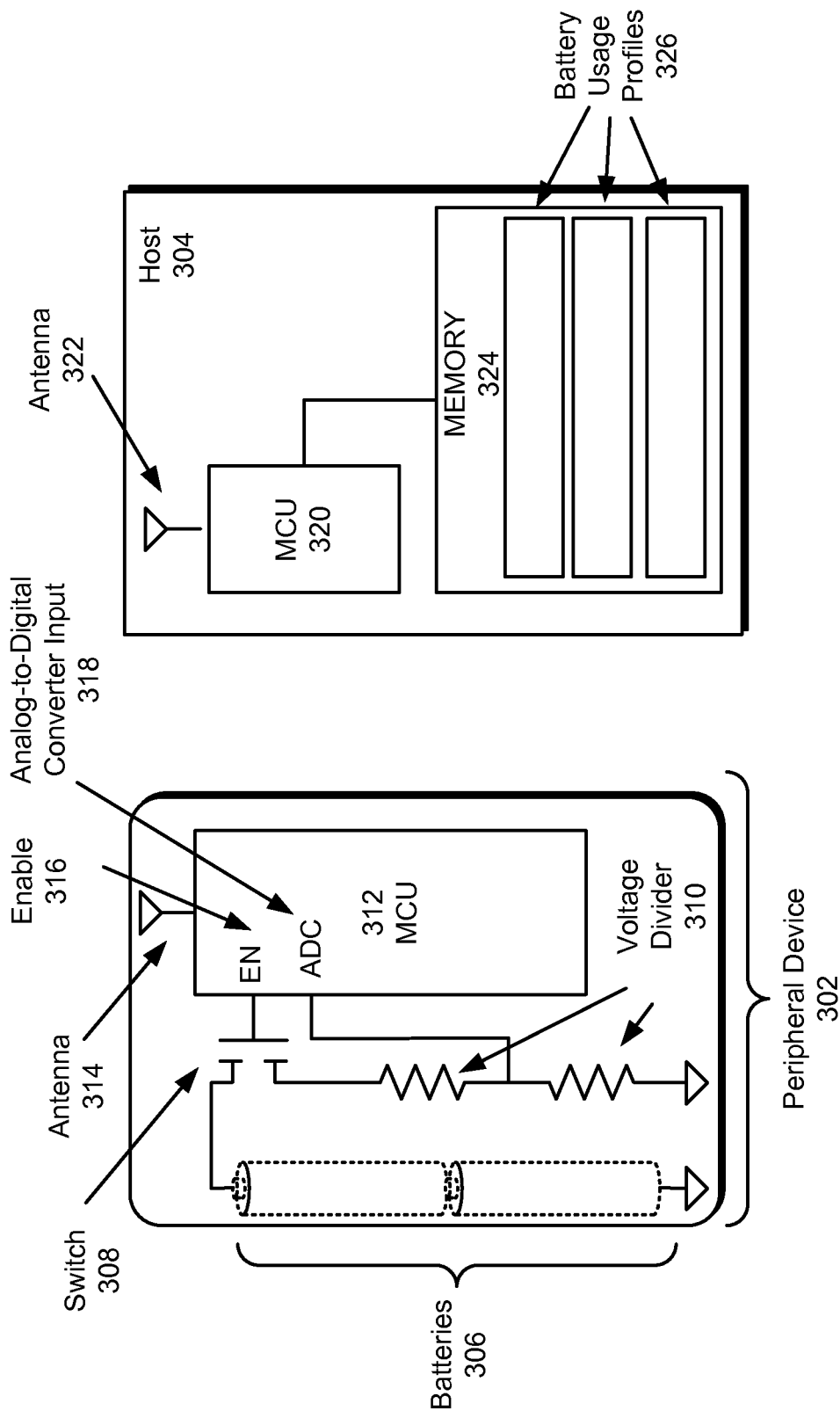
FIG. 3 shows a peripheral device and a host in accordance with an embodiment.

FIG. 3 shows a peripheral device and a host in accordance with an embodiment. In this embodiment, peripheral device 302 includes batteries 306 connected in series through switch 308 to voltage divider 310. Switch 308 is coupled to enable 316 of MCU 312, and the output of voltage divider 310 is coupled to ADC 318 of MCU 312. Antenna 314 is connected to MCU 312 and couples peripheral device 302 to host 304 using a wireless link that may include but is not limited to a Bluetooth link, or any other wireless technology now known or later developed. Note that host 304 may be any stand-alone or embedded computer or computer system including but not limited to a desktop computer, a laptop computer, a smartphone, a tablet computer, a server, an embedded computer in a television, a set top box, a digital video recorder, or any other device with one or more central processing units that can be connected to a peripheral device.

Host 304 includes MCU 320 coupled to antenna 322 which is capable of receiving and transmitting data to and from peripheral device 302. MCU 320 is coupled to memory 324, and stored in memory 324 are battery usage profiles 326. Note that, although three battery usage profiles are depicted in memory 324, any number of battery usage profiles may be stored in memory 324 without departing from the invention. Additionally, battery usage profiles 326 may each correspond to a different battery chemistry, or one or more battery usage profiles may correspond to similar battery chemistries under different usage conditions such as average current usage rate, temperature, or any other parameter that can affect the battery usage profile of a battery.

During operation of peripheral device 302, MCU 312 closes switch 308 using enable 316. When switch 308 is closed, voltage divider 310 divides the voltage output from batteries 306 to a level that is within the range of ADC 318. ADC 318 then measures the voltage output from voltage divider 310 and transmits the measured voltage value wirelessly to host 304 through antenna 314.

Host 304 receives the transmitted voltage values through antenna 322, and stores it in memory 324. After a predetermined time has elapsed, MCU 312 again performs the process described above to measure a voltage value of batteries 306 and transmit it to host 304 for storage in memory 324. After at least two voltage values have been measured, MCU 320 then determines which of the battery usage profiles 326 is the closest match to the measured voltage values using the process described above with reference to FIGS. 1 and 2A.

In some embodiments, MCU 312 transmits additional information to host 304. The additional information may include but is not limited to information that identifies the type, make, model, production year, production number, serial number, and/or other unique identifier of peripheral device 302. Additionally, MCU 312 may also transmit information related to the usage of peripheral device 302, including but not limited to: the number of Bluetooth packages transmitted, the signal strength of the Bluetooth signal, the type of Bluetooth data transmitted and/or received, the size of the Bluetooth data packets, the type and duration of user activity (e.g., for a trackpad, the contents of multi-touch data or tracking packets, or the number of fingers detected), and/or any statistical summary related to the foregoing. For example, the additional information sent by MCU 312 may include the average number of Bluetooth packets sent per hour, and a figure of merit related to activity of features of peripheral device 302. This transmitted information can then be used by MCU 320 on host 304 to determine an estimated number of milliampere hours used by batteries 306 between voltage measurements. In these embodiments, MCU 320 determines the number of milliampere hours of use of batteries 306 between each voltage measurement and uses this information as described above to help determine the battery chemistry of batteries 306 based on which battery usage profile 326 is a better fit to the measured voltages. Note that MCU 312 does not necessarily need to explicitly send the data (for example number of packets transmitted, contents of packets, signal strength, duration of user activity, and so on) to MCU 320. MCU 320 could alternatively infer this statistical data based on the packets sent during normal use of the peripheral device 302.

In other embodiments, when MCU 312 measures a voltage of batteries 306, the voltage value is converted into an estimate of the remaining battery life or other metric by MCU 312 which is then transmitted to host 304. In these embodiments, MCU 320 then obtains the measured voltages from the transmitted battery metric by reversing the process used by MCU 312 to generate the metric. The voltage value is then used by MCU 320 as described above to help determine the battery chemistry of batteries 306 based on which battery usage profile 326 is a better fit to the measured voltage values. Note that in some of these embodiments MCU 312 transmits not only the battery percentage but also the model number and firmware version of peripheral device 302. Using this information MCU 320 determines which process to use to obtain the measured voltage from the transmitted metric.

FIGS. 4A and 4B depict yet other embodiments of the present invention. In FIG. 4A, peripheral device 302 is connected to host 404A through wireless connection 406A, and host 404A is also connected to network 408. Host 404B and server 410 are also connected to network 408. Network 408 can include any system that allows computers to communicate with each other, including but not limited to any combination of one or more of the following computer networks: an intranet, an extranet, and/or the Internet. Note that any of the networks can include one or more wireless links.

In this embodiment, peripheral device 302 measures the voltage of the batteries 306 and transmits the measured voltage to host 404A as described with reference to FIG. 3. Peripheral device 302 also transmits an identifier such as a serial number that uniquely identifies peripheral device 302. Host 404A receives the voltage value and identifier, and transmits them through network 408 to server 410. Server 410 stores the voltage value and associates it with the identifier for peripheral device 302. Server 410 then transmits all measured voltage values related to batteries 306 in peripheral device 302 to host 404A through network 408. The voltage values are stored in a memory (not depicted) in host 404A and an MCU (not depicted) in host 404A determines the battery chemistry of batteries 306 in peripheral device 302 by determining which battery usage profile stored in the memory in host 404A is the best fit to the measured voltages.

In FIG. 4B, peripheral device 302 is connected to host 404B through wireless connection 406B, and host 404B is connected to server 410 through network 408. During operation, peripheral device 302 measures the voltage of batteries 306 and transmits the measured voltage and identifier for peripheral device 302 to host 404B. Host 404B receives the voltage value and identifier and transmits them through network 408 to server 410. Server 410 stores the voltage value and associates it with the unique identifier of peripheral device 302. Server 410 then transmits all measured voltage values related to batteries 306 in peripheral device 302 to host 404B through network 408. Host 404B can then determine the battery chemistry of batteries 306 in peripheral device 302 in the same manner as host 404A. In this embodiment, the battery chemistry of batteries 306 in peripheral device 302 can be determined by which ever host, 404A or 404B, peripheral device 302 is connected to at the moment. Note that peripheral device 302 may be used with any number of hosts that operate similarly to hosts 404A and 404B without departing from the present invention. For example, one Bluetooth trackpad may be used with any number of hosts, and voltage measurements of the batteries in the trackpad can be shared with each host so that the battery chemistry of the batteries can be determined no matter which host the trackpad is used with.

In some embodiments, the voltage values are also associated with a timestamp that indicates the time and date when the voltage measurement was taken. The timestamp may be generated by peripheral device 302 and transmitted with the voltage measurement, or generated by the host to which peripheral device 302 is attached, or by server 410. Server 410 uses the timestamp information to ensure that the voltage measurements are in sequence and can also then, as discussed above, determine when batteries 306 in peripheral device 302 have been replaced.

Note that in some embodiments new or updated battery usage profiles may be transmitted from server 410 to host 404A or host 404B through network 408. This may be advantageous as new, improved, or otherwise modified battery usage profiles are generated. For example, as new battery chemistry batteries, or new makes or types of peripheral device are introduced, the appropriate battery usage profile can be transferred from server 410 to host 404A and/or host 404B though network 408. In other embodiments, the battery chemistry determination occurs on server 410 and the results are transmitted through network 408 to host 404A and/or host 404B.

FIG. 5 depicts yet another embodiment of the invention. This embodiment includes host-peripheral pairs 1-N 502, with each peripheral connected to a separate host by one of the wireless connections 1-N 504. Note that each of the peripheral devices and hosts in host-peripheral pairs 1-N 502 operates similarly to peripheral device 302 and host 404A, respectively, as described above with reference to FIG. 4A. Additionally, although only three host-peripheral pairs 1-N 502 are depicted in FIG. 5, any number of host-peripheral pairs may be used without departing from the invention.

During operation, when a peripheral device measures a voltage of its batteries, the voltage along with one or more of the make, model, timestamp information, unique identifier information about the peripheral as well as usage information as described above are transmitted over a wireless connection to the host it is coupled to. The host then transmits this information through network 506 to server 508. Additionally, each host may transmit to server 508 through network 506, any battery chemistry determinations made by the host. Server 508 stores the information sent to it. In some embodiments, this information is used to generate battery usage curves based on the actual usage data sent from host-peripheral pairs 1-N 502. These battery usage profiles may then be sent to the hosts or used on the server during the battery chemistry determination process.

For example, as more users use a new peripheral device with a particular battery chemistry battery, or use an existing peripheral device with new software or in a new way, server 508 can use this data along with the voltage measurements and/or battery chemistry determinations to generate or modify existing battery usage profiles to more closely match the usage profiles measured during actual operation of the peripheral devices. Such battery usage profiles may allow for a faster or more accurate determination of the battery chemistry of batteries in a peripheral device, and also a more accurate determination of time left before the batteries need to be replaced.

Figure 6:
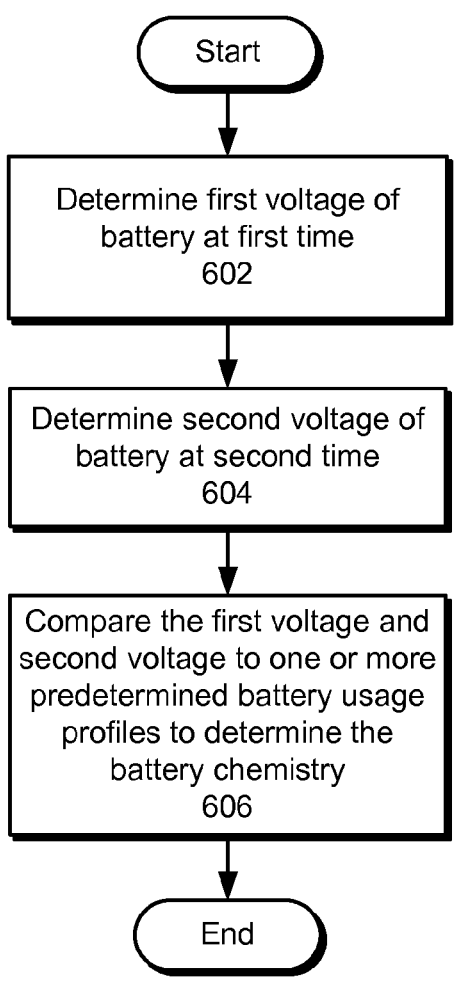
FIG. 6 shows a flowchart illustrating the process of determining the battery chemistry of a battery in a peripheral device.

FIG. 6 shows a flowchart illustrating the process of determining the battery chemistry of a battery in a peripheral device. First, a first voltage of a battery in the peripheral device is determined at a first time (step 602). Next, a second voltage of the battery is determined at a second time (step 604). Then, the first voltage and the second voltage are compared to one or more predetermined battery usage profiles to determine the battery chemistry of the battery in the peripheral device (step 606). In some embodiments, the voltage of the battery in the peripheral device is determined once every predetermined period of time, for example, every four hours, and two or more of the accumulated voltage measurements are compared to the one or more predetermined battery usage profiles to determine the battery chemistry.

Figure 7:
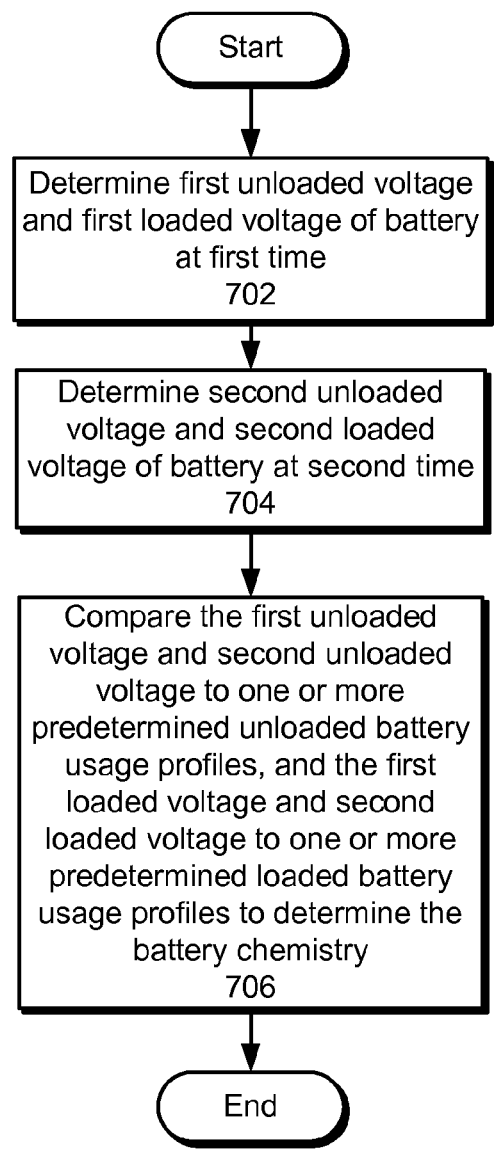
FIG. 7 shows a flowchart illustrating the process of using loaded and unloaded voltage measurements of a battery to determine the battery chemistry of the battery in a peripheral device.

FIG. 7 shows a flowchart illustrating the process of using loaded and unloaded voltage measurements of a battery to determine the battery chemistry of the battery in a peripheral device. First, a first unloaded voltage and a first loaded voltage of the battery in the peripheral device are measured at a first time (step 702). Next, a second unloaded voltage and a second loaded voltage of the battery in the peripheral device are measured at a second time (step 704). Then, the first unloaded voltage and the second unloaded voltage are compared to one or more predetermined unloaded battery usage profiles, and the first loaded voltage and the second loaded voltage are compared to one or more predetermined loaded battery usage profiles to determine the battery chemistry (step 706).

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for determining a battery chemistry for a battery in a peripheral device, comprising:

determining a first voltage of the battery at a first time corresponding to a first discharge capacity of the battery;

determining a second voltage of the battery at a second time corresponding to a second, different, discharge capacity of the battery;

comparing, by computer, the first voltage and the second voltage to one or more predetermined battery usage profiles that represent battery voltage as a function of discharge capacity to determine the battery chemistry;

using the determined battery chemistry and a corresponding battery usage profile with one or more voltage measurements to determine how much battery life remains in the battery; and generating an alert when the remaining battery life is less than a predetermined time period.

2. The computer-implemented method of claim 1, wherein comparing the first voltage and the second voltage to one or more predetermined battery usage profiles to determine the battery chemistry includes:

communicating the first voltage and the second voltage to a host, wherein the host performs the comparison.

3. The computer-implemented method of claim 2, wherein communicating the first voltage and the second voltage to the host includes communicating using wireless technology.

4. The computer-implemented method of claim 2, wherein the predetermined battery usage profile includes information transmitted to the host using the Internet.

5. The computer-implemented method of claim 4, wherein the information transmitted to the host includes information related to one or more voltages of the battery transmitted from a second host.

6. The computer-implemented method of claim 4, wherein the information transmitted to the host includes one or more updated battery usage profiles.

7. The computer-implemented method of claim 2, wherein communicating the first voltage and the second voltage to the host includes communicating information based on the first voltage and the second voltage; and wherein comparing the first voltage and the second voltage to one or more predetermined battery usage profiles includes processing the communicated information to retrieve the first voltage and the second voltage.

8. The computer-implemented method of claim 1, wherein determining the first voltage of the battery at the first time and determining the second voltage of the battery at the second time includes:

periodically determining a voltage of the battery once every predetermined time period.

9. The computer-implemented method of claim 8, wherein the predetermined time period is four hours.

10. The computer-implemented method of claim 1, wherein the peripheral device includes at least one of: a mouse, a remote control, a trackpad, a keyboard, and a wireless headset.

11. The computer-implemented method of claim 1, wherein:

determining the first voltage of the battery at the first time involves measuring a first loaded voltage and a first unloaded voltage;

determining the second voltage of the battery at the second time involves measuring a second loaded voltage and a second unloaded voltage; and comparing the first voltage and the second voltage to one or more predetermined battery usage profiles involves:

comparing the first unloaded voltage and the second unloaded voltage to one or more predetermined unloaded battery usage profiles; and comparing the first loaded voltage and the second loaded voltage to one or more predetermined loaded battery usage profiles.

12. The computer-implemented method of claim 1, wherein the predetermined battery usage profile includes information related to one or more historical battery usage profiles for the peripheral device.

13. The computer-implemented method of claim 1, including:
    determining a peripheral device usage metric, wherein determining the battery chemistry includes using the peripheral device usage metric to determine the battery chemistry.

14. A system for determining a battery chemistry for a battery in a peripheral device, comprising:
    a measuring apparatus in the peripheral device configured to:
        take a first voltage measurement at a first time corresponding to a first discharge capacity; and
        take a second voltage measurement at a second time corresponding to a second, different, discharge capacity;
    a communicating apparatus in the peripheral device configured to communicate the first voltage measurement and the second voltage measurement to a host; and
    a comparing apparatus in the host configured to:
        compare the first voltage measurement and the second voltage measurement to one or more predetermined battery usage profiles that represent battery voltage as a function of discharge amount to determine the battery chemistry;
        use the determined battery chemistry and a corresponding battery usage profile with one or more voltage measurements to determine how much battery life remains in the battery; and
        generate an alert when the remaining battery life is less than a predetermined time period.

15. The system of claim 14,
    wherein the host further includes an Internet network connection mechanism configured to receive information related to the one or more predetermined battery usage profiles; and
    wherein the comparing apparatus is further configured to use the received information to determine the battery chemistry.

16. The system of claim 14, wherein the peripheral device includes at least one of: a mouse, a trackpad, a remote control, a keyboard, and a wireless headset.

17. A non-transitory computer-readable storage medium storing instructions that when executed by a computer cause the computer to perform a method for determining a battery chemistry for a battery in a peripheral device, the method comprising:
    receiving a first voltage of the battery measured at a first time corresponding to a first discharge capacity of the battery;
    receiving a second voltage of the battery measured at a second time corresponding to a second, different, discharge capacity of the battery;
    comparing the first voltage measurement, the second voltage measurement and the estimated discharge amount to one or more predetermined battery usage profiles that represent battery voltage as a function of discharge capacity to determine the battery chemistry;
    using the determined battery chemistry and a corresponding battery usage profile with one or more voltage measurements to determine how much battery life remains in the battery; and
    generating an alert when the remaining battery life is less than a predetermined time period.

18. The non-transitory computer-readable storage medium of claim 17, wherein the predetermined battery usage profile includes one or more updated battery usage profiles transmitted using the Internet.

19. The non-transitory computer-readable storage medium of claim 17, wherein the method further includes:
    determining a peripheral device usage metric, wherein determining the battery chemistry includes using the peripheral device usage metric to determine the battery chemistry.

* * * * *